| (12) | United States Patent<br>Huang | (10) Patent No.: US 12,288,708 B2<br>(45) Date of Patent: Apr. 29, 2025 |
|---|---|---|

(54) WAFER CARRIER DRY CLEANER

(71) Applicant: NANYA TECHNOLOGY CORPORATION, New Taipei (TW)

(72) Inventor: Jih-Cheng Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 812 days.

(21) Appl. No.: 17/448,707

(22) Filed: Sep. 24, 2021

(65) Prior Publication Data

US 2023/0094352 A1    Mar. 30, 2023

(51) Int. Cl.
*H01L 21/673* (2006.01)
*B08B 5/00* (2006.01)
*H01L 21/67* (2006.01)

(52) U.S. Cl.
CPC .......... *H01L 21/67389* (2013.01); *B08B 5/00* (2013.01); *H01L 21/67017* (2013.01)

(58) Field of Classification Search
CPC ......... H01L 21/67389; H01L 21/67017; H01L 21/67772; H01L 21/67051; B08B 5/00; F26B 25/06; F26B 25/14; F24F 3/163; F24F 3/167
See application file for complete search history.

(56) References Cited

U.S. PATENT DOCUMENTS

2020/0035530 A1 *  1/2020  Kotsugai ................. B08B 17/02

FOREIGN PATENT DOCUMENTS

| CN | 106856664 A * | 6/2017 | ....... H01L 21/67034 |
| WO | WO-2005124853 A1 * | 12/2005 | ....... H01L 21/67772 |
| WO | WO-2010137556 A1 * | 12/2010 | ....... H01L 21/67772 |

OTHER PUBLICATIONS

Translation, WO-2010137556-A1 (Year: 2010).*
Translation, WO-2005124853-A1 (Year: 2005).*
Translation, CN-106856664-A (Year: 2017).*

* cited by examiner

*Primary Examiner* — Jessica Yuen
(74) *Attorney, Agent, or Firm* — CKC & Partners Co., LLC

(57) ABSTRACT

A wafer carrier dry cleaner includes a receiver, a tool and a movable nozzle. The receiver includes a clean room. The clean room includes a port used to load a wafer carrier. The wafer carrier comprises a box and a door closing an opening of the box. The tool is located in the clean room and configured to separate the door from the box. The movable nozzle is located in the clean room. The movable nozzle is configured to purge clean gas towards the box and the door at a first position between the box and the door when the box and the door are separated.

13 Claims, 12 Drawing Sheets

WAFER CARRIER DRY CLEANER

BACKGROUND

Field of Invention

The present disclosure relates to wafer carrier dry cleaners.

Description of Related Art

During the semiconductor manufacturing process, wafer carriers such as front opening unified pods (FOUPs) are used to hold wafers. The FOUPs can have valves configured to communicate with tubes to receive gas used to clean. However, once the FOUPs receive the wafers after the FOUPs are cleaned by water, the wafers received by the FOUPs are probably damaged by water since some water can remain in the FOUPs unexpectedly.

Therefore, how to provide a solution for prevent water from remaining in a purged wafer carrier is one of the subjects to be solved for the industry.

SUMMARY

One aspect of the present disclosure is relative to a wafer carrier dry cleaner.

According to one embodiment of the present disclosure, a wafer carrier dry cleaner includes a receiver, a purge chamber and a vacuum chamber. The receiver includes a clean room. The purge chamber and the vacuum chamber are located in the clean room. The clean room includes at least one port used to load a wafer carrier. The purge chamber includes a nozzle configured to purge clean gas towards the wafer carrier. A pump is connected to the vacuum chamber and configured to exhaust air in the vacuum chamber when the wafer carrier is located within the vacuum chamber.

In one or more embodiments of the present disclosure, the wafer carrier dry cleaner further includes a fan filter unit. The fan filter unit is connected to the clean room to reduce a number of particles in the clean room.

In one or more embodiments of the present disclosure, the wafer carrier dry cleaner includes a box and a door closing an opening of the box. The purge chamber further includes another nozzle. The two nozzles are configured to respectively purge the clean gas towards the box and the door after the box and the door is separated from the box.

In one or more embodiments of the present disclosure, the wafer carrier dry cleaner further includes a transport module. The transport module is located within the clean room. The transport module is located between the at least one port, the purge chamber and the vacuum chamber to transport the wafer carrier from one of the at least one port, the purge chamber and the vacuum chamber to another one of the at least one port, the purge chamber and the vacuum chamber.

In some embodiments, the wafer carrier dry cleaner further includes a robot. The robot is located on the transport module in the clean room. The wafer carrier includes a box and a door closing an opening of the box. The robot is configured to assemble the wafer carrier with the box and the door.

In one or more embodiments of the present disclosure, the nozzle is connected to a controller. The controller is configured to determine a pressure and a temperature of the clean gas. The clean gas comprises compress dry air or nitrogen with high pressure.

One aspect of the present disclosure is relative to a wafer carrier dry cleaner.

According to one embodiment of the present disclosure, a wafer carrier dry cleaner includes a receiver, a tool and a movable nozzle. The receiver includes a clean room. The clean room includes a port used to load a wafer carrier. The wafer carrier comprises a box and a door closing an opening of the box. The tool is located in the clean room and configured to separate the door from the box. The movable nozzle is located in the clean room. The movable nozzle is configured to purge clean gas towards the box and the door at a first position between the box and the door when the box and the door are separated.

In one or more embodiments of the present disclosure, the wafer carrier dry cleaner further includes a fan filter unit. The fan filter unit is connected to the clean room to reduce a number of particles in the clean room.

In one or more embodiments of the present disclosure, the movable nozzle disposed in the clean room by a connection structure adjacent the port, the connection structure is configured to allow the movable nozzle to move between the first position exposed from the port and a second position away from the port.

In one or more embodiments of the present disclosure, the wafer carrier dry cleaner further includes a transport module. The transport module is located in the clean room. The tool is located on the transport module. The transport module is configured to move the door from the port after the door is separated from the box by the tool.

In one or more embodiments of the present disclosure, the wafer carrier dry cleaner further includes a movable cover and a vacuum chamber. The movable cover and the vacuum chamber are located within the clean room. A pump is connected to the movable cover and the vacuum chamber to exhaust air. The movable cover is configured to seal the box to form an enclosed space and the vacuum chamber is configured to be seal by the door to form an enclosed chamber after the door is separated from the box.

In some embodiments, the port and the vacuum chamber are arranged vertically.

In some embodiments, the wafer carrier dry cleaner further includes a first tube, a second tube, a sub-tube and a sensor. The first tube is configured to communicate the pump with the movable cover. The second tube is configured to communicate the pump with the vacuum chamber. The sub-tube is communicated with one of the first and second tubes. The sensor is connected to the sub-tube and configured to detect properties of air flowing into the sub-tube.

One aspect of the present disclosure is relative to a wafer carrier dry cleaner.

According to one embodiment of the present disclosure, a wafer carrier dry cleaner includes a receiver, a tool, a movable cover and a vacuum chamber. The receiver includes a clean room. The clean room includes a port used to load a wafer carrier. The wafer carrier includes a box and a door closing a first opening of the box. The tool is located within the clean room and configured to separate the door from the box. The movable cover is located within the clean room and has a size substantially the same as the first opening of the box. The vacuum chamber is located within the clean room and has a second opening. The second opening has a size substantially the same as the door.

In one or more embodiments of the present disclosure, the wafer carrier dry cleaner further includes a pump. The pump is connected to the cover and the vacuum chamber to exhaust air in an enclosed space formed by the box and the movable cover and an enclosed chamber formed by the vacuum chamber and the door.

In one or more embodiments of the present disclosure, the wafer carrier dry cleaner further includes a fan filter unit. The fan filter unit is connected to the clean room to reduce a number of particles in the clean room.

In one or more embodiments of the present disclosure, the wafer carrier dry cleaner further includes a movable nozzle. The movable nozzle is located in the clean room. The movable nozzle is configured to purge clean gas towards the box and the door at a first position between the box and the door when the box and the door are separated.

In one or more embodiments of the present disclosure, the wafer carrier dry cleaner further includes a transport module. The transport module is located in the clean room. The tool is located on the transport module. The transport module is configured to move the door from the port after the door is separated from the box by the tool.

In one or more embodiments of the present disclosure, the movable cover is supported by a bracket across two sides of the port. The movable cover is configured to move along the bracket.

In one or more embodiments of the present disclosure, the port and the vacuum chamber are arranged vertically.

In summary, the wafer carriers can be cleaned without water by using the mentioned wafer carrier dry cleaner. It avoids damages of the wafer unexpected remained within the wafer carrier.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1:
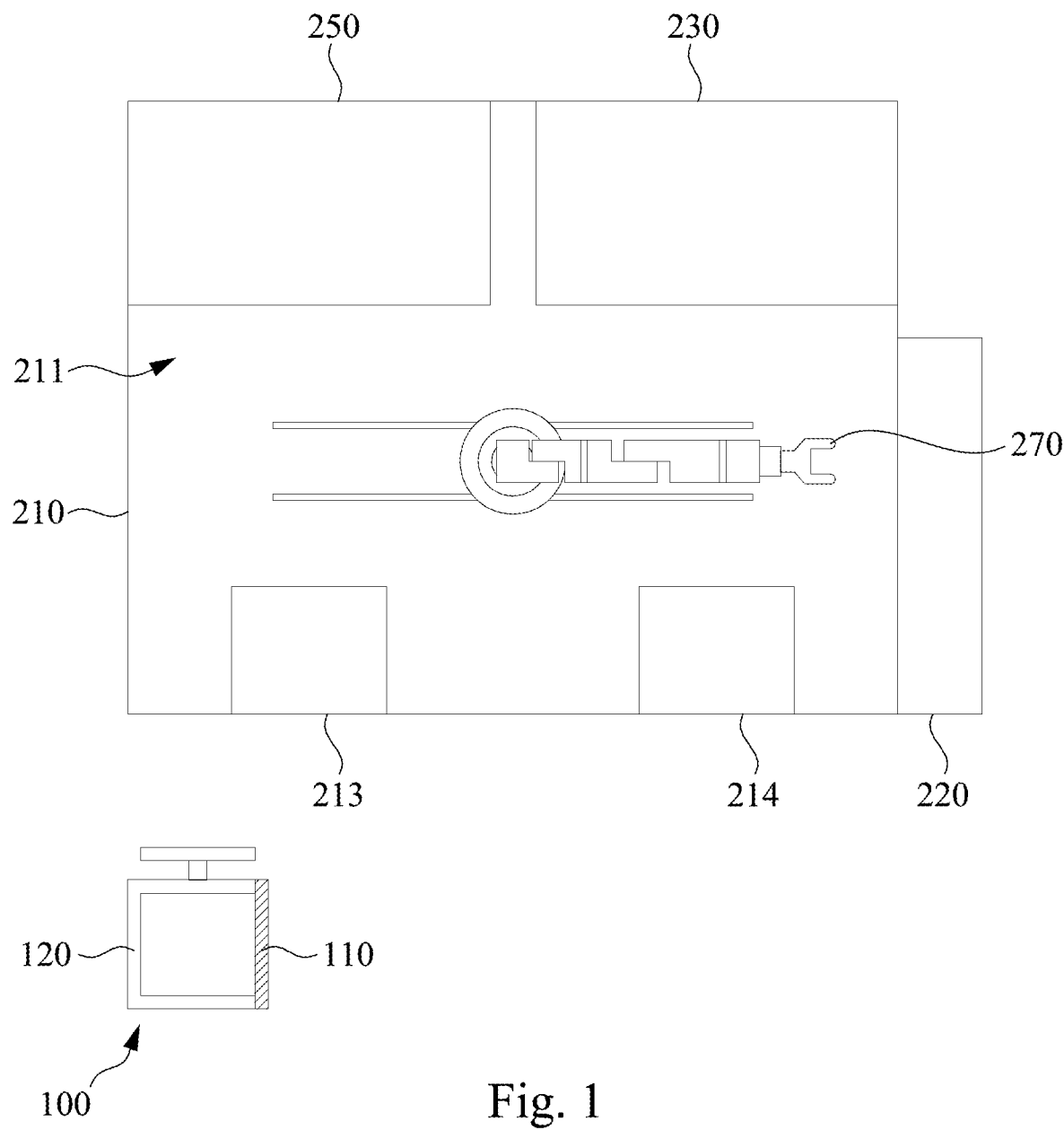
FIG. 1 illustrates a schematic top view of a wafer carrier dry cleaner according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

To prevent water from remaining in a wafer carrier, a clean process without water for a wafer carrier is need. In some embodiments, a clean process without water for a wafer carrier can be realized by a wafer carrier dry cleaner of the present disclosure.

Reference is made by FIG. 1. FIG. 1 illustrates a schematic top view of a wafer carrier dry cleaner 200 according to one embodiment of the present disclosure.

As shown in FIG. 1, in this embodiment, the wafer carrier dry cleaner 200 includes a receiver 210. The receiver 210 is used to receive a wafer carrier 100 to be cleaned. In FIG. 1, the receiver 210 includes a clean room 211. In some embodiments, the clean room 211 can be regarded as a mini environment clean room. The wafer carrier 100 to be cleaned can be transported into the clean room 211. A number of particles of the clean room 211 is less than a determined standard to ensure the wafer carrier transported into the clean room 211 will not be contaminated by the particles. For example, the determined standard includes a number of particles per volume less than a determined value.

In this embodiment, a fan filter unit 220 is connected to the clean room 211 of the receiver 210. The fan filter unit 220 includes fans used to remove the particles within the clean room 211 and filters used to filter air flow between the clean room 211 and external environment, so that the number of particles in the clean room 211 can be reduced.

As shown in FIG. 1, in this embodiment, the clean room 211 of the receiver 210 includes two ports 213 and 214. One of the two ports 213 and 214 is used to load the wafer carrier 100 to be cleaned into the clean room 211, and another is used to load the cleaned wafer carrier 100 out of the clean room 211.

In some embodiments, the clean room 211 can have only one port used to load in and out the wafer carrier 100, and space occupied by one port in the clean room 211 can be reduced.

Return to FIG. 1. In this embodiment, the wafer carrier 100 to be cleaned is a FOUP but not intended to limit to the present disclosure. The wafer carrier 100 includes a box 120 used to accommodate wafers and a door 110 used to close or seal an opening of the box 120. The wafer to be accommodated can position into the box 120 through the opening of the box 120, and the door 110 is used to close the opening of the box 120.

In FIG. 1, the wafer carrier dry cleaner 200 includes a robot arm 270 as a transport module. In this embodiment, the robot arm 270 are used to load the wafer carrier 100 into the clean room 211 from one of the two ports 213 and 214 and load the cleaned wafer carrier 100 out of the clean room 211 from another one of the two ports 213 and 214. Further, a controllable robot can be located on an end effector of the robot arm 270, and the controllable robot can be used to separate the door 110 from the box 120 of the wafer carrier 100 after the wafer carrier 100 is loaded into the clean room 211.

In this embodiment, the wafer carrier dry cleaner 200 includes a purge chamber 230 and a vacuum chamber 250. The purge chamber 230 and the vacuum chamber 250 are located within the clean room 211. After the water holder 100 to be cleaned is loaded into the clean room 211, the wafer carrier 100 can be purged in the purge chamber 230 and then the wafer carrier 100 can be configured in a vacuum environment of the vacuum chamber 250 to further remove the particles remaining on the box 120 and the door 110. In details, please refer to following discussions.

As shown in FIG. 1, the robot arm 270 is located between the purge chamber 230, the vacuum chamber 250 and the two ports 213 and 214. Therefore, the wafer carrier 100 to be cleaned can be transported between the purge chamber 230, the vacuum chamber 250 and the two ports 213 and 214.

Figure 2:
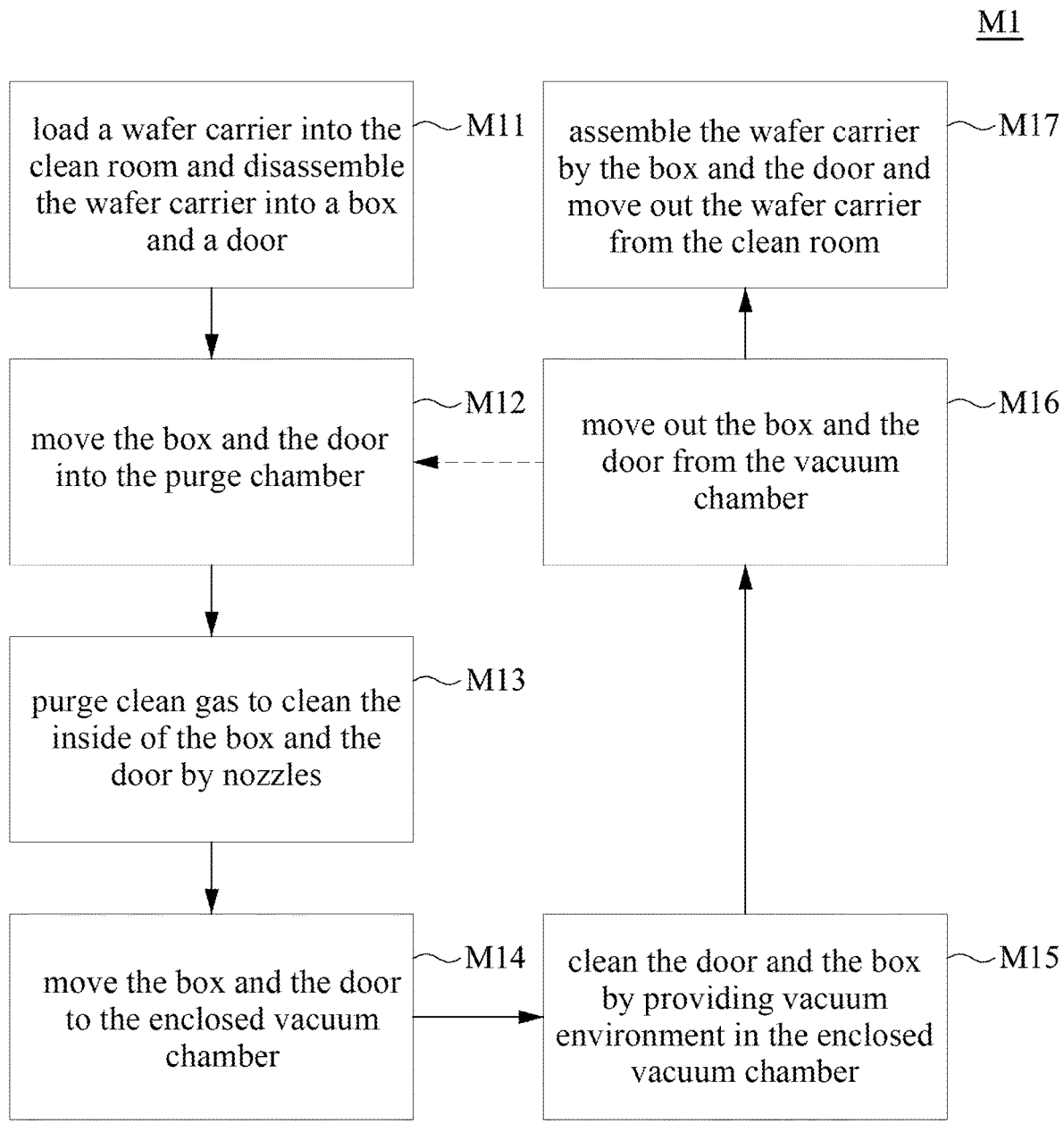
FIG. 2 illustrates an clean process of a wafer carrier dry cleaner according to one embodiment of the present disclosure.

FIG. 2 illustrates a clean process M1 of the wafer carrier dry cleaner 200 according to one embodiment of the present disclosure. In this embodiment, the clean process M1 includes steps M11~M17.

In step M11, the wafer carrier 100 to be cleaned is leaded into the clean room 211 of the receiver 210 by an input load port, which can be one of the two ports 213 and 214. In this embodiment, the input load port is the port 214. Then, the wafer carrier 100 is disassembled into the box 120 and the door 110 in the clean room 211. In some embodiments, the wafer carrier 100 is disassembled by a robot (not shown in figures) on an end effector of the robot arm 270 in the clean room 211.

Proceed to step M12, after the wafer carrier 100 is disassembled into the box 120 and the door 110, the box 120 and the door 110 is moved into the purge chamber 230 by the robot arm 270. In this embodiment, the purge chamber 230 includes two sub-rooms 231 and 232 (as shown in the following FIG. 3).

Figure 3:
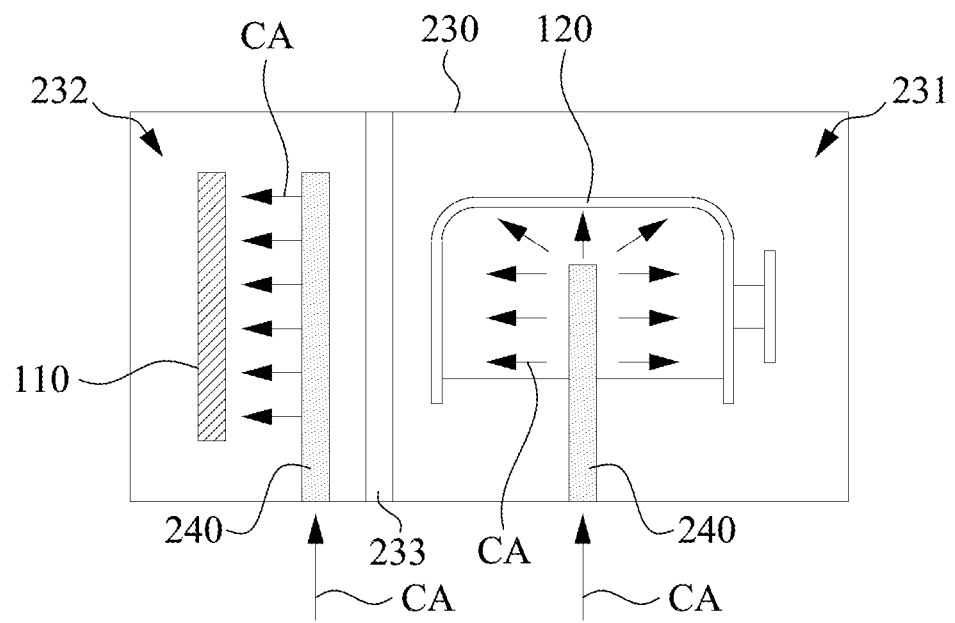
FIG. 3 illustrates a schematic view of purging in a purge chamber according to one embodiment of the present disclosure.

After the box 120 and the door 110 are moved to the two sub-rooms 231 and 232, in step M13, clean gas CA is purged towards the box 120 and the door 110 by two nozzles 240, and example details are shown as following FIG. 3.

Figure 4:
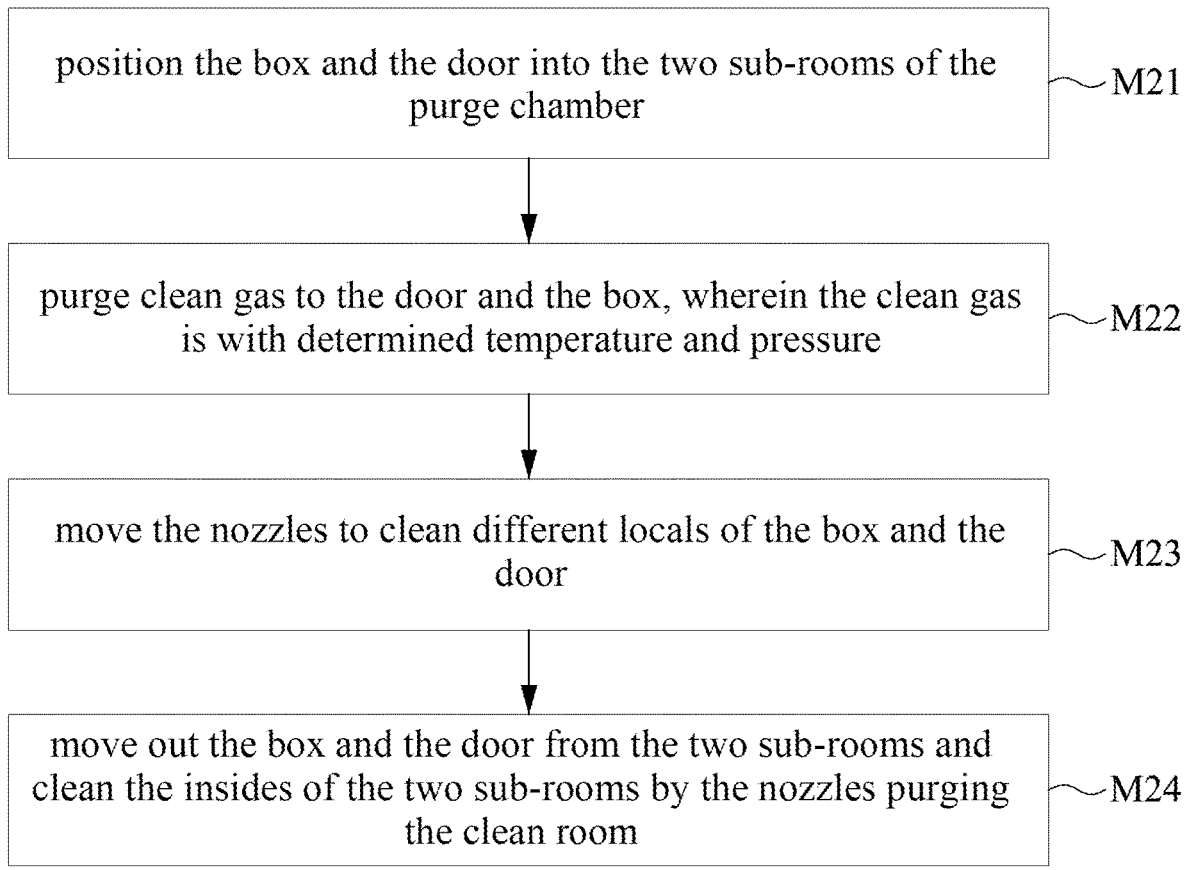
FIG. 4 illustrates a purging process of purging in a purge chamber according to one embodiment of the present disclosure.

To further describe steps M12 and M13, please refer to FIGS. 3 and 4. FIG. 3 illustrates a schematic view of purging in a purge chamber 230 according to one embodiment of the present disclosure. FIG. 4 illustrates a purging process M2 of purging in the purge chamber 230 according to one embodiment of the present disclosure. The steps M12 and M13 of the clean process M1 can be realized by the purging process M2. The purge process M2 includes steps M21-M24.

Please refer to FIGS. 3 and 4. In step M21, the box 120 and the door 110 of the wafer carrier 100 are respectively positioned to two sub-rooms 231 and 232 of the purge chamber 230. As shown in FIG. 3, the two sub-rooms 231 and 232 are spatially isolated by a wall 233.

Proceed to step M22, the box 120 and the door 110 are purged by clean gas CA in the two sub-rooms 231 and 232, respectively.

As shown in FIG. 3, in this embodiment, the wafer carrier dry cleaner 200 includes two nozzles 240 used to purge clean gas CA. After the box 120 and the door 110 are moved in the two sub-rooms 231 and 232, the two nozzles 240 move to the two sub-rooms 231 and 232, respectively. In the sub-room 231, one of the two nozzles 240 moves to inside of the box 120 and purges clean gas CA to an inner wall of the box 120. In sub-room 231, another one of the two nozzles 240 moves and purges clean gas CA to the door 110.

In some embodiments, the clean gas CA includes dry air or nitrogen with high pressure. The dry air with high pressure can be regarded as compress dry air (CDA). In some embodiment, the properties of the purged clean gas CA can be determined by controllers connected to the two nozzles 240. The determined properties of the clean gas CA include a pressure and a temperature of the clean gas CA. In some embodiments, the purged clean gas CA is with high pressure.

Continued with step M22, in step M23, the two nozzles 240 can be move to purge different locals of the box 120 and the door 110.

Proceed to step M24, the purged box 120 and the purged door 110 are moved out of the two sub-rooms 231 and 232. The purged box 120 and the purged door 110 can be moved to the clean room 211 beyond the purge chamber 230 by the robot arm 270. Then, the two sub-rooms 231 and 232 can be purged by the clean gas CA from the two nozzles 240, After being purged by the clean gas CA, the two sub-rooms 231 and 232 of the purge chamber 230 are clean and enable to receive other unpurged box 120 and door 110.

Since the number of particles of the clean room 211 is kept under the determined standard, the purged box 120 and the purged door 110 will not be contaminated by the air in the clean room 211.

Therefore, the steps M12 and M13 can be realized by the purging process M2.

In some embodiments, the wafer carrier dry cleaner 200 can have only one nozzle 240. During an example purging process, the box 120 and the door 110 can be moved to a space in the purge chamber 230, and the nozzle 240 can move to a position between the box 120 and the door 110. At the position between the box 120 and the door 110, the nozzle 240 can move and purge clean gas CA towards the box and the door 110 at the same time.

Figure 5:
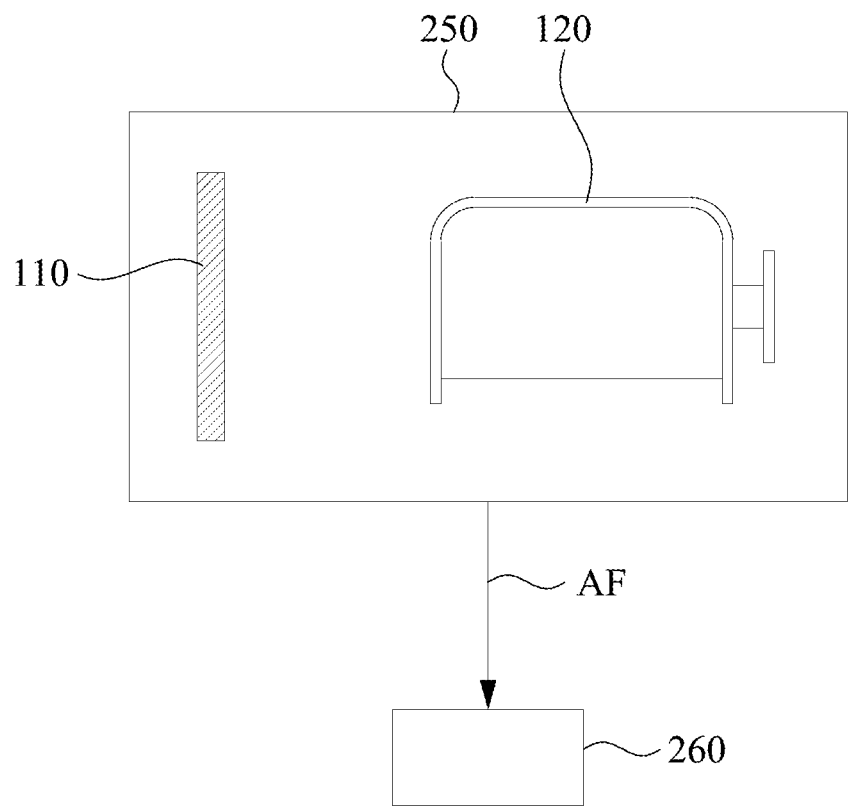
FIG. 5 illustrates a schematic view of vacuuming in a vacuum chamber according to one embodiment of the present disclosure.

Return to FIG. 2 and proceed to step M14. The box 120 and the door 110 are moved to the vacuum chamber 250, which is then enclosed. Then, in step M15, the box 120 and the door 110 can be cleaned in a vacuum environment in the enclosed vacuum chamber 250. The air in the enclosed vacuum chamber 250 can be exhausted by a pump 260 (as shown in FIG. 5). After being cleaned by the vacuum environment, in step M16, the box 120 and the door 110 are moved out of the vacuum chamber 250. In details, please refer to the following discussion.

Figure 6:
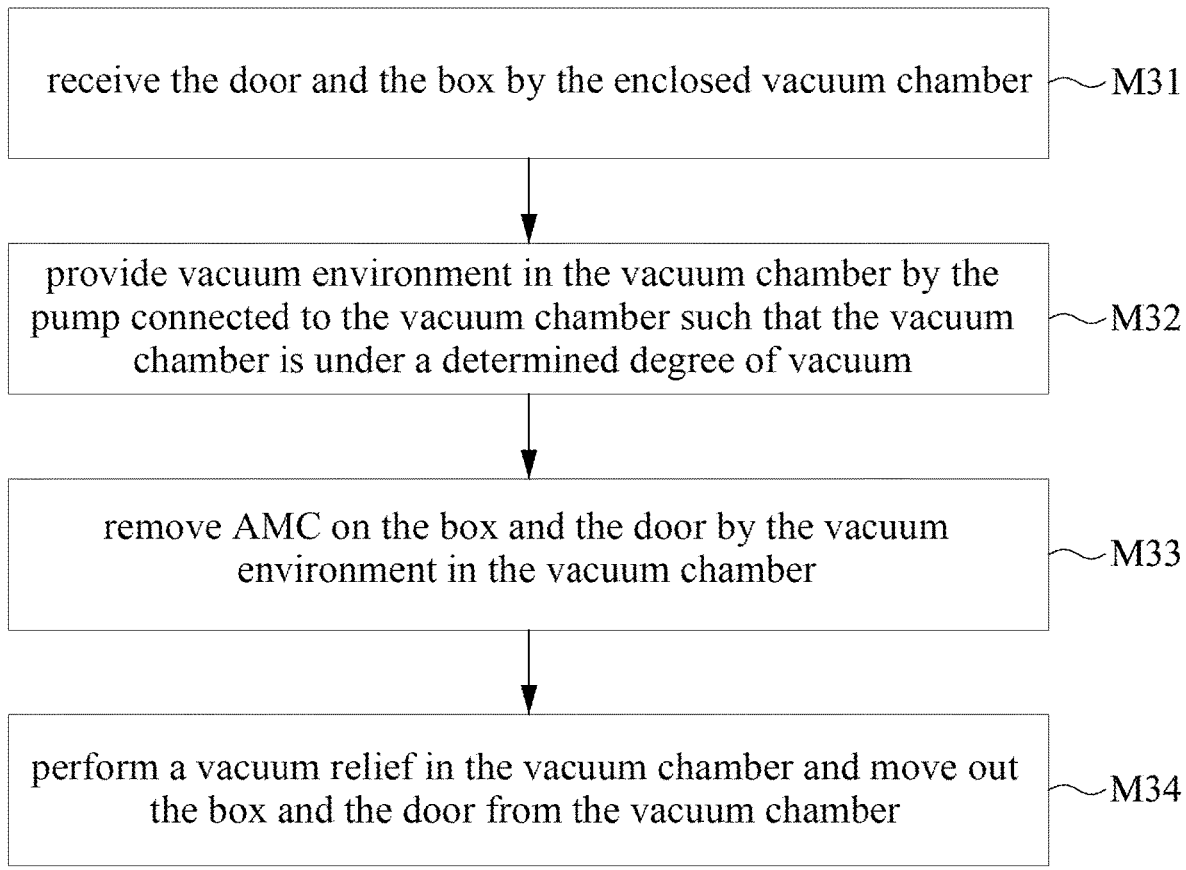
FIG. 6 illustrates a vacuuming process of vacuuming in a vacuum chamber according to one embodiment of the present disclosure.

Reference is made by FIGS. 5 and 6. FIG. 5 illustrates a schematic view of vacuuming in a vacuum chamber 250 according to one embodiment of the present disclosure. FIG. 6 illustrates a vacuuming process M3 of vacuuming in the vacuum chamber 250 according to one embodiment of the present disclosure.

In this embodiment, the wafer carrier dry cleaner 200 includes a pump 260. As shown in FIG. 5, the vacuum chamber 250 is connected to the pump 260. For the purpose of simple description, FIG. 5 schematically illustrates the connection between the vacuum chamber 250 and the pump 260. The pump 260 is used to exhaust air in the vacuum chamber 250 to provide a vacuum environment in the vacuum chamber 250. In FIG. 5, air flow AF is exhausted by the pump 260 from the vacuum chamber 250.

In some embodiments, the pump 260 is communicated with the vacuum chamber 250 by a tube, so that the air flow AF flows into the tube and the air in the vacuum chamber 250 can be exhausted by the pump 260 through the tube. In some embodiments, the tube communicated with the pump 260 can further be communicated with a sub-tube connected to a sensor, and properties of the air flowing into the sub-tube can be detected and monitored.

Please refer to FIG. 6. In step M31, the box 120 and the door 110 are received by the vacuum chamber 250, as shown in FIG. 5.

Proceed to step M32. Inside the vacuum chamber 250, vacuum environment is provided through exhausting air flow AF by using the pump 260 connected to the vacuum chamber 250. Therefore, the vacuum chamber 250 is under a determined degree of vacuum.

In step M33, since the box 120 and the door 110 is under the vacuum environment in the vacuum chamber 250, the particles remained on the box 120 and the door 110 can easily leave to the vacuum environment of the vacuum chamber 250. Then, the particles in the vacuum environment of the vacuum chamber 250 can be removed by following the extracted air flow AF. Therefore, in this embodiment, airborne molecular contaminants (AMC) unexpectedly remained on the box 120 and the door 110 can be removed by the vacuum environment in the vacuum chamber 250.

In step M34, a vacuum relief for the vacuum environment of the vacuum chamber 250 is performed. In some embodiments, the vacuum chamber 250 includes a valve (not shown in figures) used to perform vacuum relief for the enclosed vacuum chamber 250. Then, the box 120 and the door 110 are moved out of the vacuum chamber 250 by the robot arm 270 to the clean room 211 beyond the vacuum chamber 250.

Also, since the number of particles of the clean room 211 is kept under the determined standard, the box 120 and the door 110 cleaned by vacuum environment will not be contaminated by the air in the clean room 211.

Therefore, steps M14, M15 and M16 can be realized by vacuuming process M3.

Return to FIG. 2. Optionally, after the box 120 and the door 110 are moved out from the vacuum chamber 250, the box 120 and the door 110 can move back to the purge chamber 230 and the purging process M2 can be performed again. According to a cleaning recipe, one or more purging processes M2 and vacuuming processes M3 can be performed and repeat. In FIG. 2, the optional flow is illustrates as a dash line arrow.

Continued with step M16, in step M17, the wafer carrier 100 is assembled by the box 120 and the door 110 closing the opening of the box 120. The assembling of the wafer carrier 100 can be performed in the clean room 211 by the controllable robot on the end effector of the robot arm 270. After being assembled, the wafer carrier 100 is moved out of the clean room 211 through an output load port. In this embodiment, the output load port is the port 213 opposite to the port 214.

As such, the clean process M1 without using water can be realized by the wafer carrier dry cleaner 200. It prevents the unexpectedly remained wafer from damaging the wafer accommodated in the wafer carrier 100 cleaned through the clean process M1.

Figure 7A:
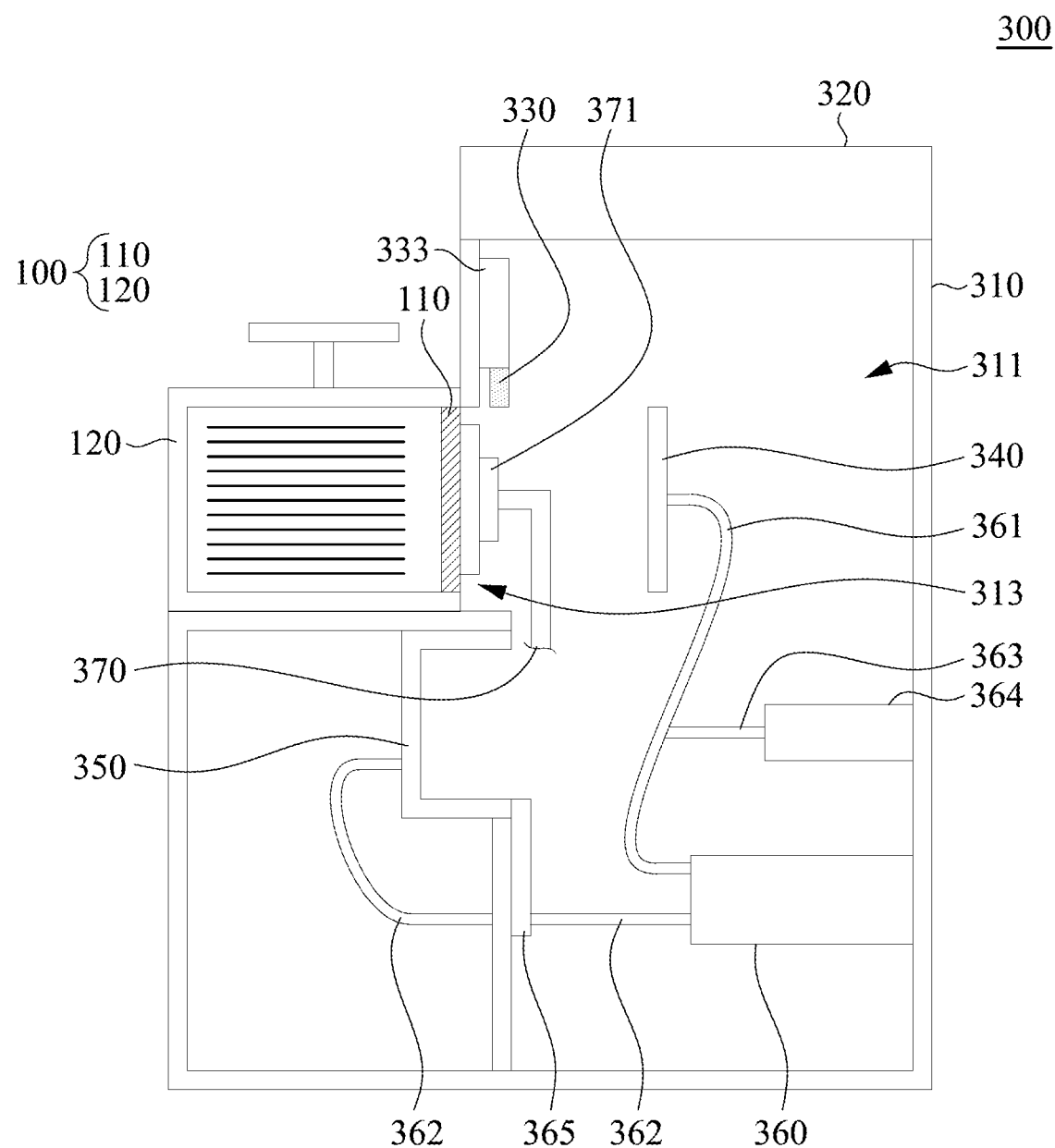
FIG. 7A illustrates a schematic side view of a wafer carrier dry cleaner according to one embodiment of the present disclosure.
Figure 7B:
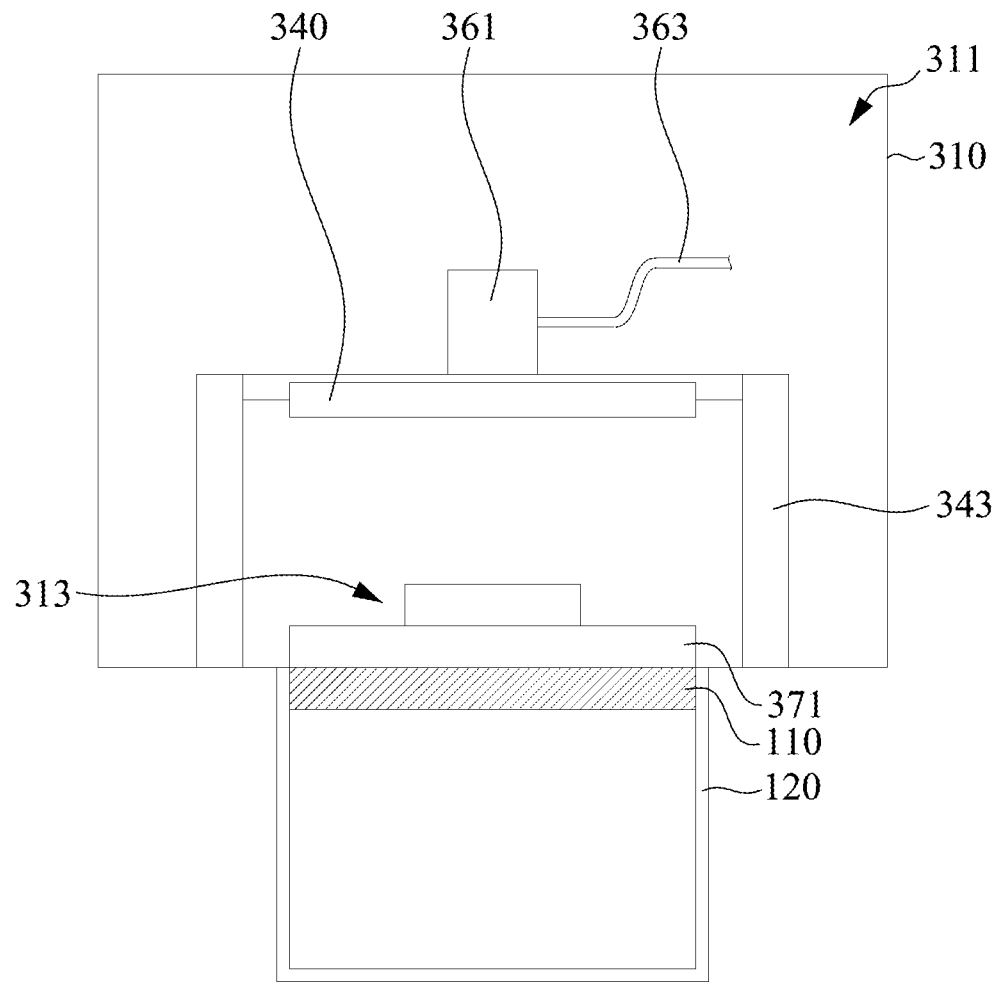
FIG. 7B illustrates a schematic cross-section view of a wafer carrier dry cleaner according to one embodiment of the present disclosure.

Reference is made by FIGS. 7A and 7B. FIG. 7A illustrates a schematic side view of a wafer carrier dry cleaner 300 according to one embodiment of the present disclosure. FIG. 7B illustrates a schematic cross-section view of the wafer carrier dry cleaner 300 according to one embodiment of the present disclosure. The wafer carrier dry cleaner 300 can also realize a clean process without water, thereby avoiding wafer damages caused by unexpectedly remained water in the wafer carrier.

As shown in FIGS. 7A and 7B, in this embodiment, the wafer carrier dry cleaner 300 includes a receiver 310. The receiver 310 includes a clean room 311. A number of particles of the clean room 311 is less than a determined standard. Similarly, in this embodiment, the wafer carrier dry cleaner 300 includes a fan filter unit 320 connected to the clean room 311. The fan filter unit 320 includes fans used to remove the particles within the clean room 311 and filters used to filter air flow between the clean room 311 and external environment, so that the number of particles in the clean room 311 can be reduced.

In FIG. 7A, the clean room 311 includes a port 313 used to load a wafer carrier 100 to be cleaned. In this embodiment, the wafer carrier 100 to be cleaned can be regarded as a FOUP and include a door 110 and a box 120. The box 120 is used to accommodate wafers. Specifically, the wafers to be accommodated can position into the box 120 through an opening of the box 120, and the door 110 is configured to seal the opening of the box 120.

As shown in FIG. 7A, an opening of the box 120 is aligned with the port 313 when the wafer carrier 100 is loaded by the wafer carrier dry cleaner 300.

As shown in the schematic cross-section of the receiver 310, in FIG. 7A, the receiver 310 is with an L-shape. Therefore, the wafer carrier 100 to be cleaned can be supported by a top surface of the receiver 310 and be aligned with the port 313 of the clean room.

FIG. 7B illustrates the cross-section view corresponding to a cross-section across the wafer carrier 100, the port 313 and a top of the receiver 310.

In FIGS. 7A and 7B, the wafer carrier dry cleaner 300 includes a nozzle 330, a robot arm 370, an tool 371, a movable cover 340, a vacuum chamber 350 and a pump 360 located within the clean room 311 of the receiver 310. The tool 371 is located on an end effector of the robot arm 370.

In this embodiment, the nozzle 330 is located upon the port 313. As shown in FIG. 7A, the nozzle 330 is connected to the clean room 311 by a connection structure 333, so that the nozzle 330 can move along a direction in which the connection structure 333 extends.

In some embodiments, the connection structure 333 is an extending rod, which is controllable and has an end where the nozzle 330 is located. In such case, the nozzle 330 can move up and down adjacent the port 313.

In some embodiments, the nozzle 330 is connected to a controller (not shown in figures) to determine a pressure and a temperature of the clean gas. In some embodiments, the clean gas includes compress dry air or nitrogen with high pressure.

As shown in FIG. 7A, the pump 360 is connected to the movable cover 340 and the vacuum chamber 350 by tubes 361 and 362, and the movable cover 340 and the vacuum chamber 350 can be used to exhaust air from enclosed spaces through the pump 360.

In this embodiment, a sub-tube 363 is communicated with the tube 361 connected to the movable cover 340, and the sub-tuber 363 is connected to a sensor 364. Therefore, some air exhausted by the movable cover can flow into the sub-tube 363, and properties of the air flowing into the sub-tube 363 can be measured and monitored through the sensor 364. In some embodiments, the properties of the air to be measured in the sub-tube 363 includes air pressure, a number of particles per volume and a composition of airborne molecular contamination (AMC).

In the cross-section view of FIG. 7B, the movable cover 340 is supported on a sidewall of the receiver 310 by a bracket 343, and the movable cover 340 can move along the bracket 343. For the purpose of clear description, the bracket 343 is not illustrated on FIG. 7A. In this embodiment, the bracket 343 extends across two sides of the port 313, and the bracket 343 has two arms used to support the movable cover 340, and the movable cover 340 can move along the two arms of the bracket 343. As shown in FIG. 7B, a gap between the two arms supporting the movable cover 340 is greater a thickness of the movable cover 340.

Return to FIG. 7A. In this embodiment, the vacuum chamber 350 connected to the pump 360 is located under the surface in which supports the wafer carrier 100. In other words, the port 313 and the vacuum chamber 350 connected to the pump 360 are arranged vertically. The pump 360 connected to the vacuum chamber 350 through the tube 362. In FIG. 7A, the tube 362 extends along a bottom of the receiver 310.

The robot arm 370 can be regarded as a transport module within the clean room 311. The tool 371 configured on the robot arm 370 are used to separate the door 110 from the box 120. When the wafer carrier 100 is loaded by the wafer carrier dry cleaner 300, the tool 371 on the robot arm 370 is directly connected to the door 110 to separate the door 110 from the box 120. Therefore, after the door 110 is separated by the tool 371, the robot arm 370 can move down the door 110 to the vacuum chamber 350 under the port 313, and the door 110 closes the vacuum chamber 350 to form an enclosed chamber. In details, please refer to the following discussion.

Figure 8A:
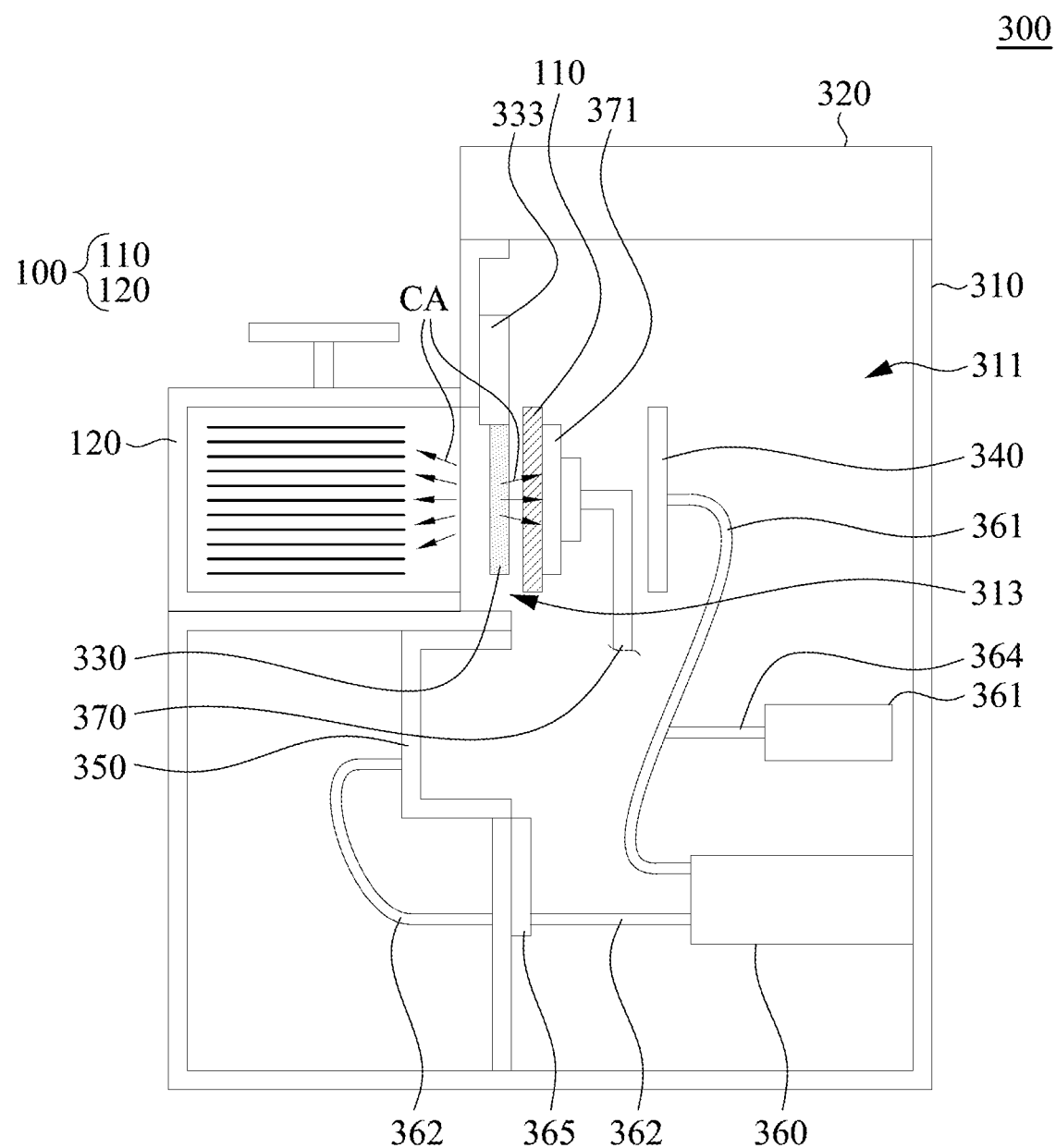
FIGS. 8A and 8B respectively illustrate schematic top view and side view during a purging in the wafer carrier dry cleaner according to one embodiment of the present disclosure.
Figure 8B:
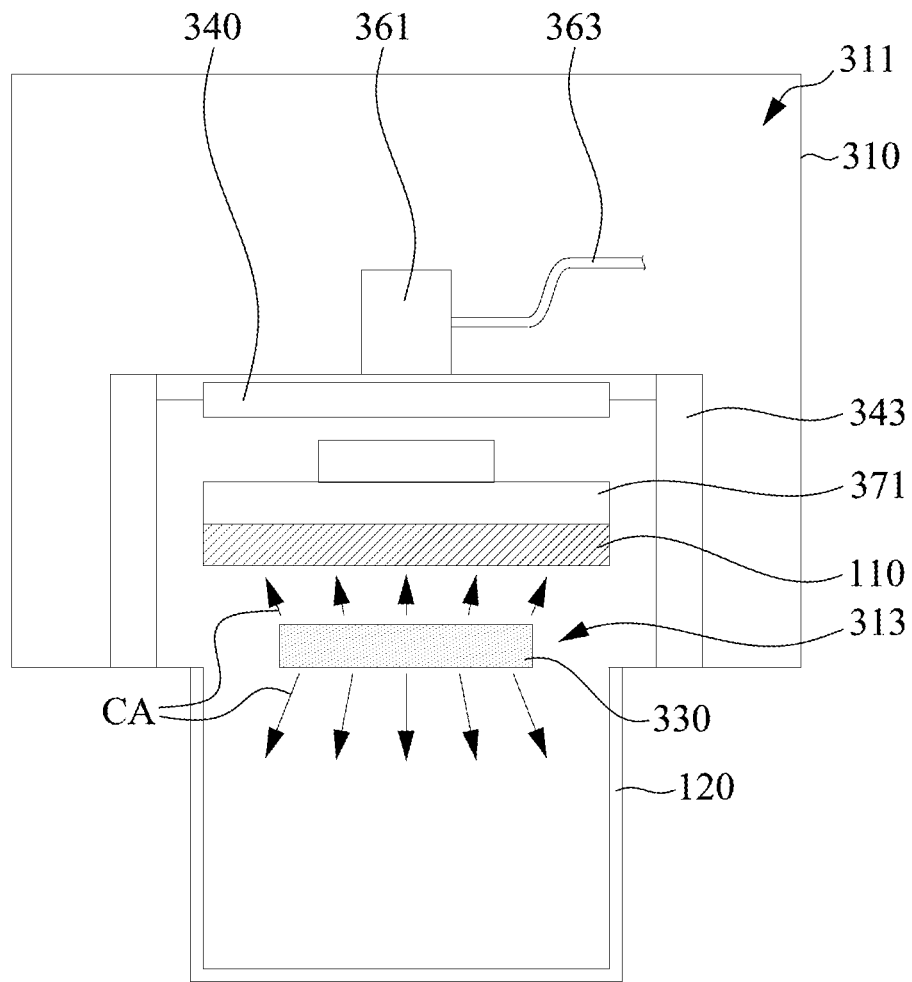
Figure 9A:
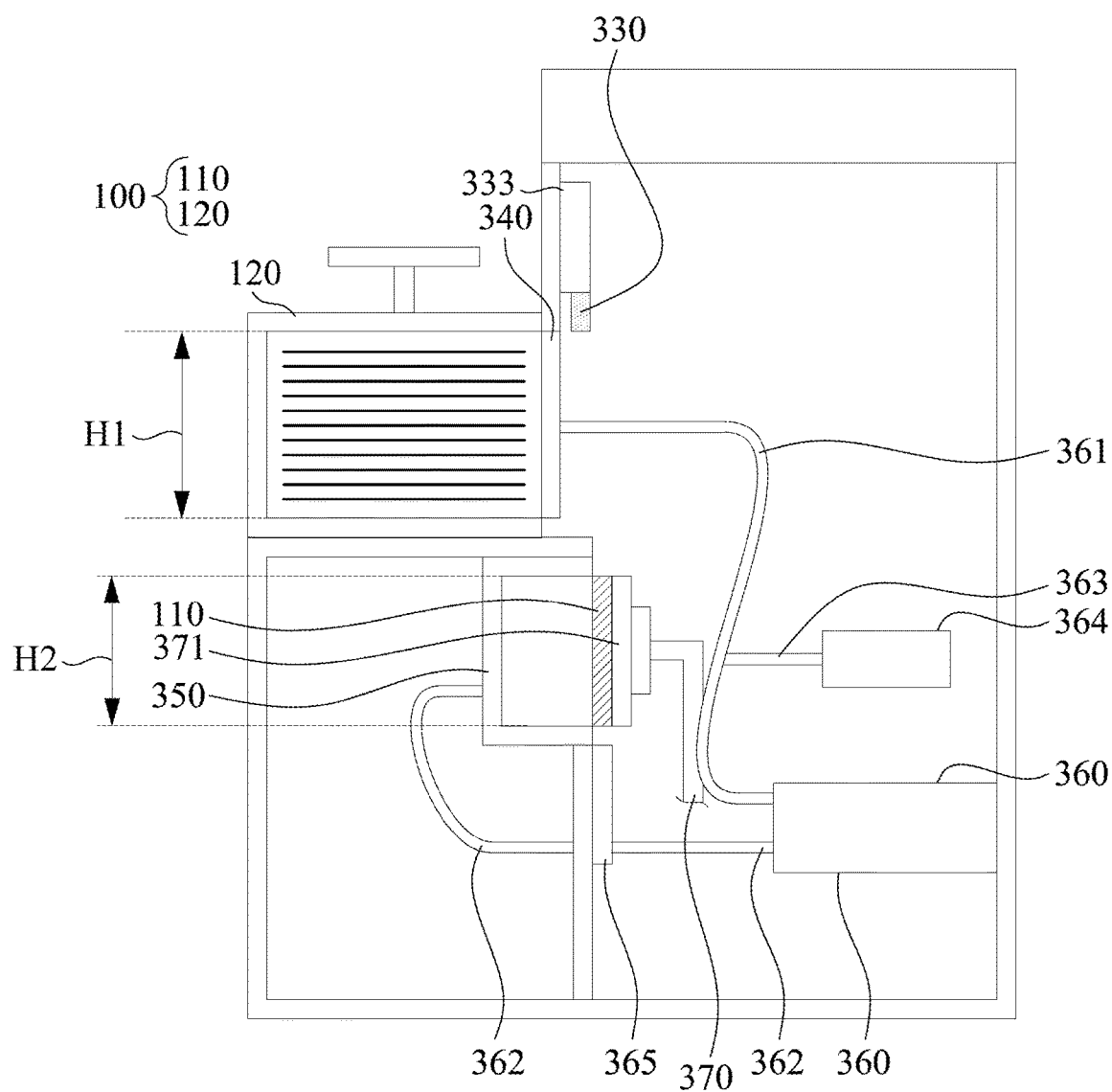
FIGS. 9A and 9B respectively illustrate schematic top view and side view during a vacuuming in the wafer carrier dry cleaner according to one embodiment of the present disclosure.
Figure 9B:
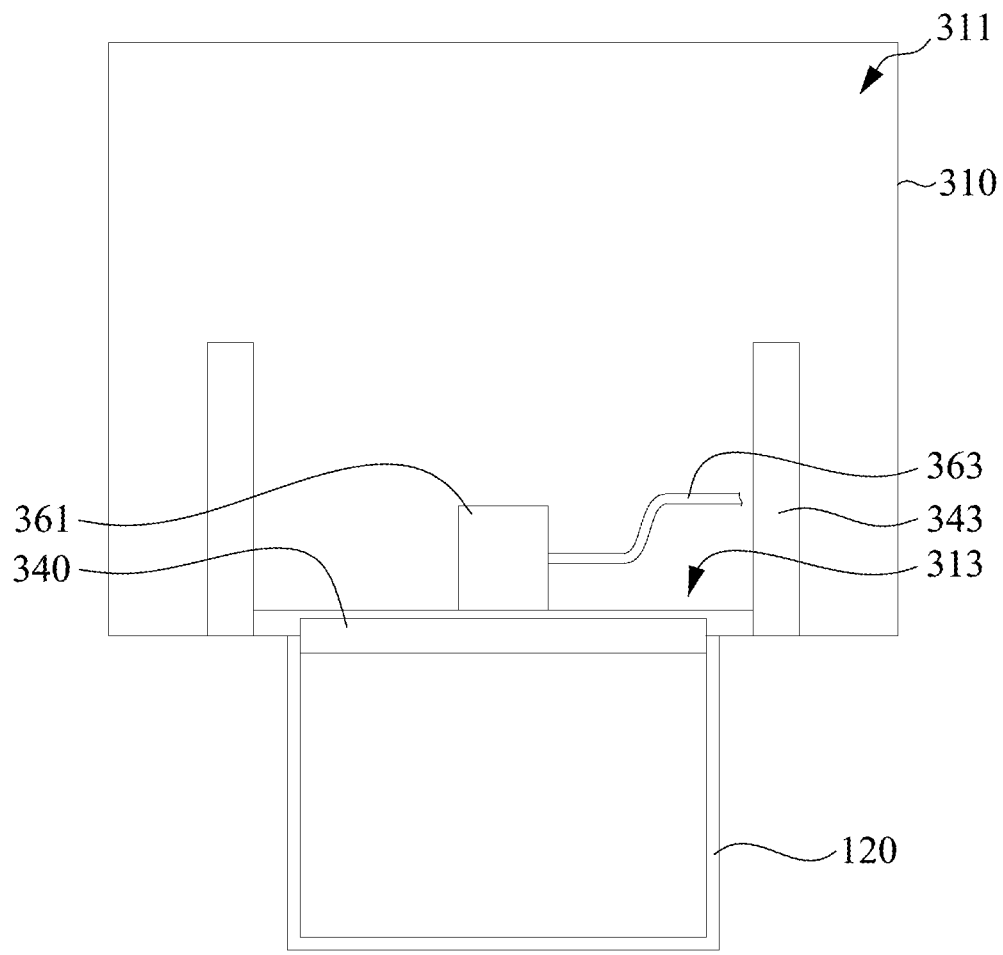

FIGS. 7A, 8A and 9A respectively illustrate different schematic side view in different steps of a clean process without water. FIGS. 7B, 8B and 9B illustrate cross-section views corresponding to FIGS. 7A, 8A and 9A, respectively.

In FIGS. 7A and 7B, the wafer carrier 100 to be cleaned is loaded on the wafer carrier dry cleaner 300. The door 110 of the wafer carrier 100 is aligned with the port 313 of the receiver 310. After the wafer carrier 100 is loaded by the port 313 of the receiver 310, the robot arm 370 drives the tool 371, so that the tool 371 is in contact with the door 110 of the wafer carrier 100. Therefore, the door 110 can be separated from the box 120 of the wafer carrier 100 and moved by the robot arm 370. In some embodiments, the tool 371 includes a controllable robot used to capture the door 110. In some embodiments, the tool 371 includes front-opening interface machine standard (FIMS).

Since the nozzle 330 is still located at a position upon the port 313, the nozzle 330 is not shown in the schematic cross-section view of FIG. 7B.

Continued with FIGS. 7A and 7B, FIGS. 8A and 8B respectively illustrate schematic top view and side view during a purging in the wafer carrier dry cleaner 300 according to one embodiment of the present disclosure.

As shown in FIGS. 8A and 8B, the door 110 is separated from the box 120 by the robot arm 370, and then the nozzle 330 is moved to a position between the separated door 110 and box 120, so that the nozzle 330 is exposed from the port 313 to purge clean CA towards the box 120 through the port 313. Therefore, the nozzle 330 can purge clean gas CA to the box 120 and the door 110 at the same time.

In some embodiments, during purging, the nozzle 330 can move up and down along the connection structure 333 to purge clean gas to different locals of the box 120 and the door 110.

In some embodiments, the nozzle 330 is with a rectangle-shape. The rectangle-shape of the nozzle 330 can be similar with the shapes of the door 110 or the opening of the box 120. In such case, the nozzle 330 can purge the clean gas CA through the overall areas of the door 110 and the box 120 quickly.

Continued with FIGS. 8A and 8B, FIGS. 9A and 9B respectively illustrate schematic top view and side view during a vacuuming in the wafer carrier dry cleaner 300 according to one embodiment of the present disclosure.

After purging, the nozzle 330 moves back to the original position, which is upon the port 313 and away from the port 313.

In some embodiments, the nozzle 330 can be located a first position adjacent the port 313 before purging. During purging, the nozzle 330 moves a second position between the box 120 and the door 110. The second position is exposed from the port 313 so that the nozzle 330 is enable to purge clean gas CA towards the box 120 out of the clean room 311. After purging, the nozzle 330 moves away from the second position exposed from the port 313 to the original first position adjacent but not exposed from the port 313.

For the box 120 of the wafer carrier 100 to be cleaned, in FIGS. 9A and 9B, the movable cover 340 moves along the bracket 343 and seals the box 120. As shown in FIG. 9A, a height of the movable cover 340 is the same as a height H1 of the opening of the box 120. Therefore, the pump 360 can exhaust air in the box 120 to provide a vacuum environment inside the box 120. The particles unexpectedly remained on an inner wall of the box 120 will leaves. Through the sub-tube 363 communicated with the tube 361, which couples the pump 360 and the movable cover 340, properties inside the box 120 can be measured and monitored.

As shown in FIG. 9B, In this embodiment, since the size of the movable cover 340 is substantially the same as the size of the opening of the box 120, the size of the movable cover 340 is also substantially the same as the size of the port 313.

As shown in FIG. 9A, the door 110 of the wafer carrier 100 is moved to seal the vacuum chamber 350 connected to the pump 360. The vacuum chamber 350 has a size substantially the same as the door 110. In FIG. 9A, the door 110 has a height substantially the same as a height H2 of an opening of the vacuum chamber 350. The vacuum chamber 350 and the door 110 forms an enclosed space, and the pump 360 exhausts air in the enclosed space through the tube 362 to provide vacuum environment inside the closed space. As such, the particles unexpected remained on the door 110 can be removed by the vacuum environment. In other words, for the purpose of cleaning the box 120 and the door 110 by vacuuming, a size of the opening of the box 120 is substantially the same as a sized of the vacuum chamber 350 to be sealed by the door 110. As shown in FIG. 9A, the height H1 of the box 120 is the same as the height H2 of the vacuum chamber 350.

Then, the door 110 can be moved back to the clean room 311. In some embodiments and according a cleaning recipe, one or more purging processes (as shown in FIGS. 8A and 8B) and vacuuming processes (as shown in FIGS. 9A and 9B) can be performed and repeat.

After being cleaned, the wafer carrier 100 is assembled by the box 120 and the door 110 closing the box 120. The door 110 is moved out the clean room 311 through the port 313. The assembling of the wafer carrier 100 can be performed by the tool 371 on the end effector of the robot arm 370. After being assembled, the wafer carrier 100 is loaded out from the receiver 310 of the wafer carrier dry cleaner 300.

Therefore, a clean process without using water can be realized by the wafer carrier dry cleaner 300, and it also prevents the unexpectedly remained wafer from damaging the wafer accommodated in the wafer carrier 100 cleaned through the clean process.

In summary, wafer carrier dry cleaners are provided in the present disclosure, and clean processes without using water can be realized by the wafer carrier dry cleaner of the present disclosure. By performing clean processes without using water for a wafer carrier, it prevents wafers accommodated in the cleaned wafer carrier from being damaged by water.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A wafer carrier dry cleaner, comprising:
a receiver comprising a clean room, wherein the clean room comprises a port used to load a wafer carrier, and the wafer carrier comprises a box and a door closing an opening of the box;
a tool located in the clean room and configured to separate the door from the box;
a movable nozzle disposed in the clean room, wherein the movable nozzle is configured to purge clean gas towards the box and the door at a first position between the box and the door when the box and the door are separated;
a movable cover and a vacuum chamber, wherein the movable cover and the vacuum chamber are located within the clean room; and
a pump connected to the movable cover and the vacuum chamber to exhaust air, wherein the movable cover is configured to seal the box to form an enclosed space and the vacuum chamber is configured to be sealed by the door to form an enclosed chamber after the door is separated from the box.

2. The wafer carrier dry cleaner of claim 1, further comprising:
a fan filter unit connected to the clean room to reduce a number of particles in the clean room.

3. The wafer carrier dry cleaner of claim 1, wherein the movable nozzle is disposed in the clean room by a connection structure adjacent the port, the connection structure is configured to allow the movable nozzle to move between the first position exposed from the port and a second position away from the port.

4. The wafer carrier dry cleaner of claim 1, further comprising:
a transport module located in the clean room, wherein the tool is located on the transport module, and the transport module is configured to move the door from the port after the door is separated from the box by the tool.

5. The wafer carrier dry cleaner of claim 1, wherein the port and the vacuum chamber are arranged vertically.

6. The wafer carrier dry cleaner of claim 1, further comprising:
a first tube configured to communicate the pump with the movable cover;
a second tube configured to communicate the pump with the vacuum chamber;
a sub-tube communicated with one of the first and second tubes; and
a sensor connected to the sub-tube and configured to detect properties of air flowing into the sub-tube.

7. A wafer carrier dry cleaner, comprising:
a receiver comprising a clean room, wherein the clean room comprises a port used to load a wafer carrier, and the wafer carrier comprises a box and a door closing a first opening of the box;
a tool disposed within the clean room and configured to separate the door from the box;
a movable cover disposed within the clean room and having a size substantially the same as the first opening of the box; and
a vacuum chamber disposed within the clean room and having a second opening, wherein the second opening has a size substantially the same as the door.

8. The wafer carrier dry cleaner of claim 7, further comprising:
a pump connected to the movable cover and the vacuum chamber to exhaust air in an enclosed space formed by the box and the movable cover and an enclosed chamber formed by the vacuum chamber and the door.

9. The wafer carrier dry cleaner of claim 7, further comprising:
a fan filter unit connected to the clean room to reduce a number of particles in the clean room.

10. The wafer carrier dry cleaner of claim 7, further comprising:
a movable nozzle disposed in the clean room, wherein the movable nozzle is configured to purge clean gas towards the box and the door at a first position between the box and the door when the box and the door are separated.

11. The wafer carrier dry cleaner of claim 7, further comprising:
a transport module located in the clean room, wherein the tool is located on the transport module, and the transport module is configured to move the door from the port after the door is separated from the box by the tool.

12. The wafer carrier dry cleaner of claim 7, wherein the movable cover is supported by a bracket across two sides of the port, and the movable cover is configured to move along the bracket.

13. The wafer carrier dry cleaner of claim 7, wherein the port and the vacuum chamber are arranged vertically.

* * * * *